US009642271B2

United States Patent
Palmer

(10) Patent No.: US 9,642,271 B2
(45) Date of Patent: May 2, 2017

(54) CORD CONTAINMENT DEVICE

(71) Applicant: Timothy David Palmer, Riverside, CT (US)

(72) Inventor: Timothy David Palmer, Riverside, CT (US)

( * ) Notice: Subject to any disclaimer, the term of this patent is extended or adjusted under 35 U.S.C. 154(b) by 0 days.

(21) Appl. No.: 14/790,285

(22) Filed: Jul. 2, 2015

(65) Prior Publication Data

US 2017/0006720 A1      Jan. 5, 2017

(51) Int. Cl.
*H05K 5/02*      (2006.01)

(52) U.S. Cl.
CPC ................. *H05K 5/0247* (2013.01)

(58) Field of Classification Search
USPC .......................................... 174/135; 439/579
See application file for complete search history.

(56) References Cited

U.S. PATENT DOCUMENTS

| 4,210,380 A | * | 7/1980 | Brzostek | H01R 13/5833 |
| | | | | 439/456 |
| 4,944,694 A | * | 7/1990 | Dorn | H01R 13/72 |
| | | | | 439/501 |
| 6,362,987 B1 | * | 3/2002 | Yurek | H01R 13/6633 |
| | | | | 363/146 |
| 7,817,405 B2 | * | 10/2010 | Neumann | H02B 1/52 |
| | | | | 174/17 R |

\* cited by examiner

*Primary Examiner* — Dhirubhai R Patel

(57) ABSTRACT

A cord containment device that includes: an oval shaped container, where the container includes a bottom portion and a top portion: a lid that forms the top portion, where the lid seals the container; a surface and a side wall that form the bottom portion; a plurality of cord guides over the surface; and a plurality of inlet/outlets around the sidewall. In one embodiment, a plurality of ports may be aligned between the plurality of inlet/outlets. Each inlet/outlet preferably includes a flap opening and each flap opening is made of rubber.

5 Claims, 1 Drawing Sheet

CORD CONTAINMENT DEVICE

BACKGROUND OF THE INVENTION

Field of Invention

The present invention relates to a cord containment device that is used to contain and support excess electrical power cording in a sealed container.

Description of Related Art

Power cords are used to connect various electrical devices. A power cords may extend directly from electrical devices such as appliances and may be plugged directly into an outlet. Many times an extension cord is necessary to provide even more length to the pre-determined length of a particular power cord for an appliance. Further multiple appliances may be used at a single location. As a result, multiple appliances result in multiple power cords that are connected to an existing outlet or extension. As a result, many cords are usually confined to one particular space and therefore cause tangling between the cords over a period of time. On occasion, the power cords are too long or have excess length than necessary for a particular outlet. Therefore it would be advantageous to have a means to contain the additional cord length to avoid the entanglement of the cords in a particular area.

SUMMARY OF THE INVENTION

The present invention relates to a cord containment device that includes: an oval shaped container, where the container includes a bottom portion and a top portion: a lid that forms the top portion, where the lid seals the container; a surface and a side wall that form the bottom portion; a plurality of cord guides over the surface; and a plurality of inlet/outlets around the sidewall. In one embodiment, a plurality of ports may be aligned between the plurality of inlet/outlets. Each inlet/outlet preferably includes a flap opening and each flap opening is made of rubber.

DETAILED DESCRIPTION

The present invention relates to a cord containment device that includes an oval or puck-shaped container where the container includes a bottom portion and a top portion. The top portion forms a lid that seals the container and therefore the cord is draped through the bottom portion of the container. The bottom portion includes a surface and a sidewall. The sidewall includes a plurality of inlets around the side wall. The inlets allow for the insertion of a cord and the exiting of the cord through the container. Further plurality of the cord guide posts are over the surface of the bottom portion. These cord guides allow for the wrapping and draping of the cord within the container as a means to contain the excess cord length. Pathways are provided into the container through the inlets along the sidewall and the cord is draped through the series of guides and then the power plug is exited out of one of the openings or inlets along the sidewall. Once secured within the containment device the lid is placed over the bottom portion and therefore seals the containment device. Further along the sidewall are vent ports and they allow for the venting of the containment device during use. The ports are located between the inlets or outlets that are provided along the sidewall. In one particular embodiment the guide posts are provided in a series of rows spaced along the bottom portion of the containment device.

Figure 1:
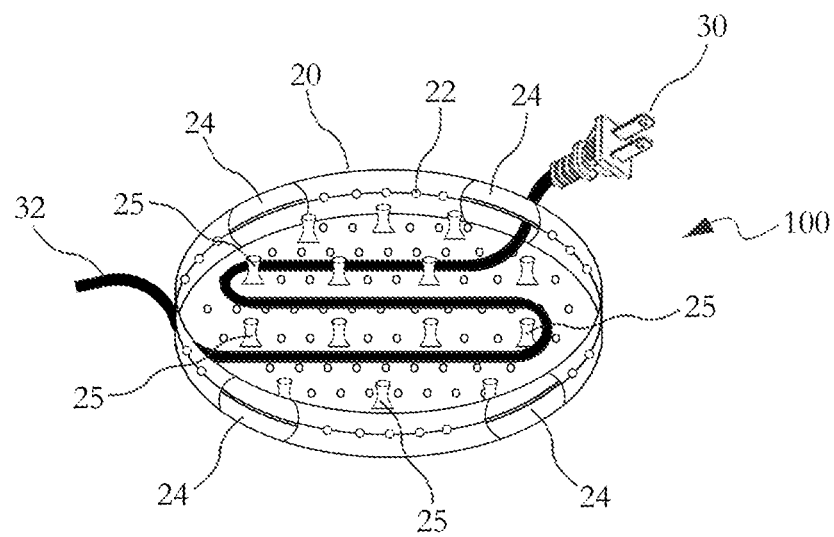
FIG. 1 depicts an overview of the cord draped through a bottom portion of a cord containment device in accordance with the present invention.

In reference to FIG. 1, a Containment Device 100 in accordance with the present invention is depicted. The Containment Device 100 includes a bottom portion as shown in FIG. 1. This bottom portion includes a Side Wall 20 and extends around the circumference of a surface provided within the Containment Device 100. Further within the Containment Device 100 are Guides 25 that preferably are positioned in rows as shown in FIG. 1. Further features of the Side Wall 20 include Inlet/Outlet 24 that may be equally positioned along the Side Wall 20. The Vent Ports 22 are preferably provided between the Inlet/Outlets 24. The Vent Ports 22 allow for the flow of ambient air and any water or moisture through the Containment Device 100. Further a Cord 32 is shown entering an Inlet/Outlet 24 that is weaved through the Guides 25. The Cord 32 extends outwardly at an opposing Outlet 24 as can be evidenced by the exposure of a Plug 30 at the end of the Cord 32. This configuration shown in FIG. 1 is for exemplary purposes as other configurations of the Guides 25 through the Containment Device 100 may be contemplated. Further more than one cord may possibly be intertwined through the Guides 25 shown in the containment device.

Figure 2:
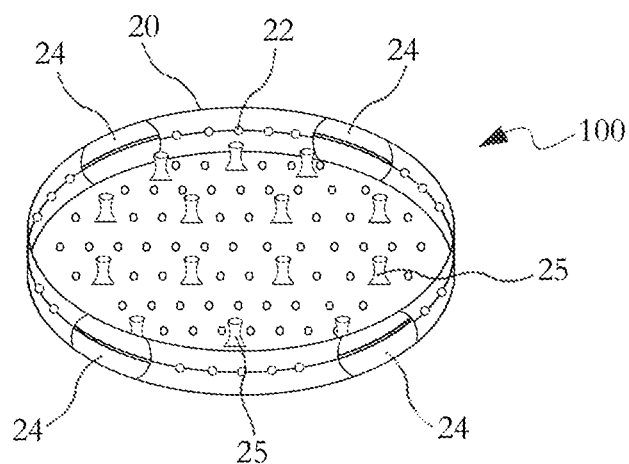
FIG. 2 depicts the bottom portion of the cord containment device without the insertion of a cord.

FIG. 2 depicts the Containment Device 100 without a cord weaved through the Guides 25. FIG. 2 shows a clear layout of the guides in four rows extending across the surface. The Vent Ports 22 are clearly shown along the Side Wall 20 between each Inlet/Outlet 24. Preferably the Guides 25 are made of rubber and the Inlet/Outlets 24 may include rubber flaps. The Vent Ports 22 allow for both the flow of air and any moisture that may be in the environment where the Containment Device 100 is used.

What is claimed is:

1. A cord containment device comprising:
 a. an oval puck shaped container,
 b. a surface within the container and a side wall extending from the surface;
 c. a plurality of cord guides over the surface, wherein the cord guides shorter than the side wall and adapted to enable the weaving of a cord through the container;
 d. a plurality of inlet/outlets around the sidewall; and
 e. a plurality of ports aligned between the plurality of inlet/outlets, wherein the ports are adapted to allow the flow of air and any moisture/water through the containment device is used.

2. The cord containment device according to claim 1, where each inlet/outlet includes a flap opening.

3. The cord containment device according to claim 2, where the flap opening is made of rubber.

4. The cord containment device according to claim 1, where the plurality of cord guides is arranged in rows.

5. The cord containment device according to claim 4, where the cord guides are arranged in four rows.

* * * * *